United States Patent [19]

Mitsuoka et al.

[11] Patent Number: 4,623,439
[45] Date of Patent: Nov. 18, 1986

[54] THIN FILM OF NI-CO-FE TERNARY ALLOY AND PROCESS FOR PRODUCING THE SAME

[75] Inventors: Katsuya Mitsuoka, Hitachi; Shinji Narishige, Mito; Akira Kumagai, Hitachi; Masaaki Sano, Hitachi; Shinichi Hara, Hitachi; Masanobu Hanazono, Mito, all of Japan

[73] Assignee: Hitachi, Ltd., Tokyo, Japan

[21] Appl. No.: 658,161

[22] Filed: Oct. 5, 1984

[30] Foreign Application Priority Data

Oct. 7, 1983 [JP] Japan ............................. 58-188862

[51] Int. Cl.⁴ ............................................. C23C 14/00
[52] U.S. Cl. ............................. 204/192.2; 204/192.3; 427/48; 427/132; 427/250; 427/294
[58] Field of Search ................. 427/48, 132, 250, 294; 204/192 M, 192 N

[56] References Cited

U.S. PATENT DOCUMENTS

| | | | |
|---|---|---|---|
| 3,047,423 | 7/1962 | Eggenberger et al. | 427/250 |
| 3,095,319 | 6/1963 | Williams | 427/132 |
| 3,303,117 | 2/1967 | Flur | 204/192 M |
| 3,577,326 | 5/1971 | Liebschutz | 427/132 |
| 4,239,835 | 12/1980 | Iijima et al. | 427/132 |

OTHER PUBLICATIONS

Beam et al, "Anisotropy Control of Ni-Fe Films through Sequenced-Field Deposition," IEEE Tran. on Magneties, vol. MAG-1, 1964, pp. 66-67.
McGuire et al, "Anisotropic Magnetoresistance in Ferromagnetic 3d Alloys" IEEE Trans. on Magnetics, vol. MAG-11, No. 4, Jul. 1975, pp. 1018-1038.
Collins et al "The Magnetoresistance Effect in Non-Magnetorestrictive Ni-Fe-Co Film", Thin Solid Films, 48 (1978) pp. 247-255.
Sanders, "Ni-Fe-Co An Alternative to Permalloy for Bubble Domain Detection" IEEE Tran. on Magnetics, vol. MAG-19, No. 2, Mar. 1983, pp. 104-110.
Bradley, "Properties of Magnetic Films for Memory System", J. of Applied Physics Suppl. to vol. 33, No. 3, Mar. 1962, pp. 1051-1057.
Tolman, "Nonmagnetostrictive Composition of Fe-Ni-Co Films", J. of Applied Physics, vol. 138, 1967, pp. 3409-3410.
Bozorth, "Ferromagnetism" 4 ed. 1951, p. 165.
Sakakima "Properties of Amorphous Alloy Films Mainly Composed of Co-Nb", IEEE Trans. on Magnetics, vol. MAG-19, No. 2, Mar. 1983, pp. 131-135.

Primary Examiner—John P. Sheehan
Attorney, Agent, or Firm—Antonelli, Terry & Wands

[57] ABSTRACT

A magnetic thin film of Ni-Co-Fe ternary alloy containing at most 75% by weight of Ni, 10 to 90% by weight of Co, and at most 15% by weight of Fe, which shows the magnetostriction constant between $+2\times10^{-6}$ to $-2\times10^{-6}$ and shows a uniaxial magnetic anisotropy of at most 10 Oe.

The film is formed through the vacuum evaporation of the alloy during which two orthogonal external magnetic fields, directions x and y, are alternately applied over the deposition surface of a substrate.

The film is suitable for a core material of a thin film magnetic head with a higher recording density.

3 Claims, 6 Drawing Figures

THIN FILM OF NI-CO-FE TERNARY ALLOY AND PROCESS FOR PRODUCING THE SAME

This invention relates to a magnetic thin film and a process for producing the same, and more particularly this invention relates to a thin film of Ni-Co-Fe ternary alloy having a small anisotropic magnetic field, a high magnetic permeability in the high-frequency region and a high saturation magnetic flux density and suited for a core material used in a magnetic thin-film head for signal reading and recording and to a process for producing the same.

BACKGROUND OF THE INVENTION

A magnetic thin film formed from Permalloy of about 80% Ni and 20% Fe has been widely used as a core of a magnetic thin-film head. A magnetic thin film of this kind is featured in that it performs a high-speed switching operation in the high-frequency region.

A thin film of Permalloy with a magneto-striction constant within the range of $\pm 2 \times 10^{-6}$ has an anisotropic magnetic field of 3 to 5 Oe, and a saturation magnetic flux density of as high as about 1 T. Therefore, there has been a problem that the film is undesirable to improve the recording density, the structural reliability, and the resolving power of a magnetic head.

Beam and Siegle disclose application of time-sequenced orthogonal fields, at 12, 3, 6 then 9 o'clock, during deposition of Permalloy films for improving and centroling the anisotropy of the films (see IEEE TRANSACTIONS ON MAGNETICS, VOL. MAG-1, 1964 pp. 66–67).

When a magnetic thin film having a saturation magnetic flux density larger than that of the Permalloy is developed as a core material of a magnetic thin-film head, the following three advantages are achieved: an increased recording density, an improved structural reliability, and an improved resolving power of the magnetic head.

In order to improve the magnetic properties of the Permalloy, an attempt has been made to increase the saturation magnetic flux density of Permalloy by adding Co as the third element to a Ni-Fe binary alloy which is the base composition of Permalloy.

The above attempt is disclosed in a number of well-known references. For example, Bradly studied the magnetic properties of a thin film of Ni-Co-Fe ternary alloy and found that when the magnetrostriction constant is reduced to zero, the thin film shows a saturation magnetic flux density higher than that of a thin film of Permalloy and that when the amount of Co added exceeds 10% by weight, the anisotropic magnetic field exceeds 10 Oe, and as a result the magnetic permeability decreased (see Journal of Applied Physics, Supplement to Vol. 33 (1962) pp. 1051–1057).

Tolman discloses that when a thin film Ni-Co-Fe ternary alloy having an approximately non-magnetrostriction constant is formed under application of a unidirectional external magnetic field, both its anisotropic magnetic field and coercive force are increased by the amount of Co (see Journal of Applied Physics, Vol. 38 (1967) pp. 3409–3410).

Further, Bozorth discloses that an alloy composition providing a nearly non-magnetostriction constant (i.e. a composition in the range of 0–80% by weight of Ni, 0–90% by weight of Co, and 0–20% by weight cf Fe) had a saturation magnetic flux density larger than that of Permalloy (see, "Ferrromagnetism" 4th edition, published by Van Nostrand, p. 165).

Sakakima discloses that the magnetic permeability of a cobalt-base alloy film was increased by annealing the film, after its formation, under application of a rotating magnetic field (see IEEE Transactions on Magnetics, Vol. Mag-19, 1983, pp. 131–135).

SUMMARY OF THE INVENTION

It is an object of this invention to provide a thin film of Ni-Co-Fe ternary alloy having a higher saturation magnetic flux density than that of Permalloy, a smaller anisotropic magnetic field and, thus, showing a high magnetic permeability in a high-frequency region, and suited as a core material used in a magnetic thin film head, and also to provide a process for producing the same.

The thin film of Ni-Co-Fe ternary alloy of this invention has a composition of at most 75% by weight of Ni, 10 to 90% by weight of Co, and at most 15% by weight of Fe, a magnetostriction constant of the film is selected to be in the range of from $+2 \times 10^{-6}$ to $--2 \times 10^{-6}$ and the film has a uniaxial magnetic anistropy whose field is at most 10 Oe.

Further, the thin film of this invention is formed by depositing a Ni-Co-Fe ternary alloy on a substrate under alternate application of an external magnetic field at a given frequency along the surface of the substrate in two orthogonal directions.

DESCRIPTION OF THE PREFERRED EMBODIMENT

The magnetic thin film core comprises a flat part and a part with step where the film crosses over insulated coils of the magnetic head.

Figure 1:
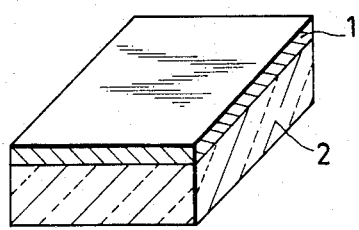
FIG. 1 is a perspective view showing a film formed on a flat area of a substrate.
Figure 2:
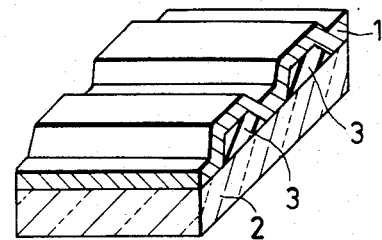
FIG. 2 is a perspective view showing a film formed on a substrate, with stepped area.
Figure 3:
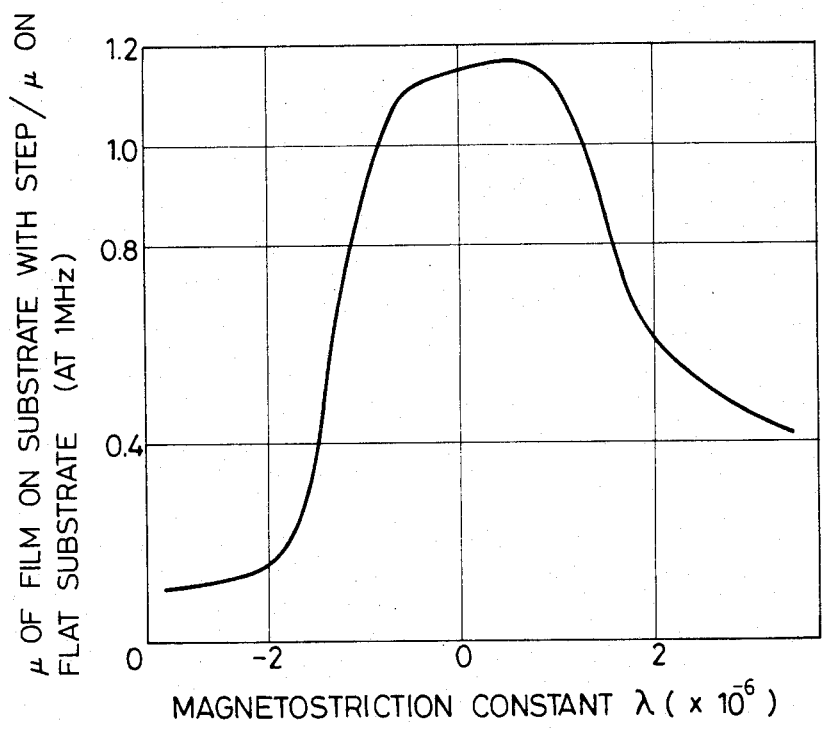
FIG. 3 is a diagram showing the relationship between a magnetostriction constant $\lambda$ and a ratio of $\mu$ of the film formed on the substrate with step to $\mu$ of that formed on the flat area.

An average magnetic permeability of the entire film in the flat part and in the part with step differ. Namely, when a magnetic film 1 is formed on a flat area of a glass substrate 2, as shown in FIG. 1, the magnetic permeability of the film at a high frequency of 1 MHz does not change with a little variation in the magnetostriction constant. On the contrary, when a magnetic film 1 is formed on a glass substrate 2 having 5 $\mu$m high steps over insulators 3 arranged at a 200 $\mu$m pitch, the magnetic permeability of the film at a high frequency of 1 MHz changes greatly with a variation in the magnetostriction constant. FIG. 3 shows this relationship.

The ratio of $\mu$ of the film in the part with step to that in the flat part has to be kept above a predetermined value not to endanger the total magnetic permeability of the magnetic thin film core as a whole. The magnetostriction constant λ in the range of from $+2\times10^{-6}$ to $-2\times10^{-6}$ is found out to satisfy the above requirement.

An alloy composition for the magnetic thin film of this invention is within the range of at most 75% by weight of Ni, 10 to 90% by weight of Co, and at most 15% by weight of Fe, so that a magnetostriction constant of the magnetic thin film of this invention is kept within the range from $+2\times10^{-6}$ to $-2\times10^{-6}$.

The production of the Ni-Co-Fe ternary alloy film having an anisotropic magnetic field of at most 10 Oe is carried out by depositing fine particles of Ni-Co-Fe ternary alloy on a substrate by vacuum evaporation under alternate application of an external magnetic field at a given frequency in two orthogonal directions in parallel with the deposition surface of the substrate.

Figure 4:
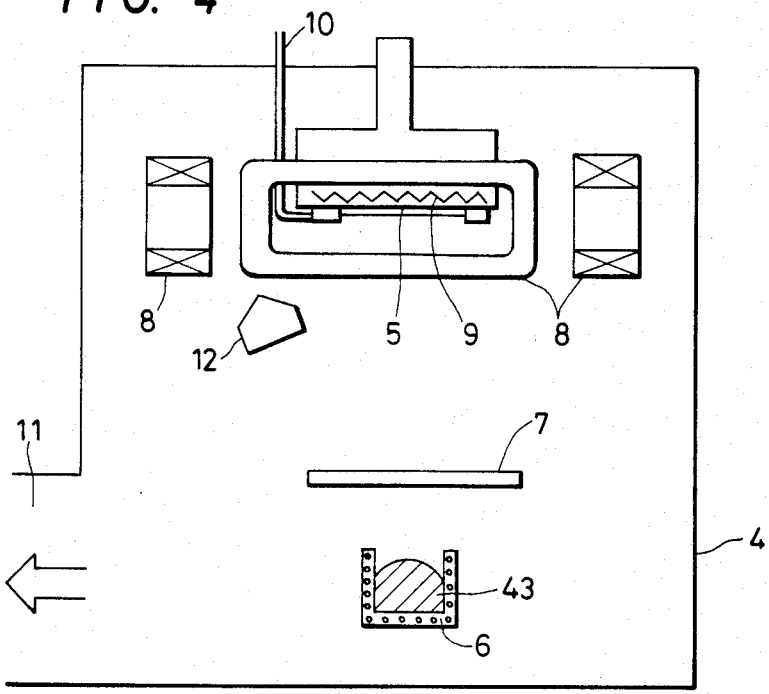
FIG. 4 is one illustrative schematic diagram of a production apparatus used for forming the film of this invention.

Now, a process for producing a thin film by using an evaporation apparatus as shown in FIG. 4 is explained.

FIG. 4 is an illustrative schematic diagram showing the evaporation apparatus used in the production process of the thin film of this invention, wherein 4 is a sealed chamber. At the upper part of the chamber 4, a substrate 5 is held. At the lower part of the chamber 4 is placed a resistance heating crucible 6 which is opposed through a shutter 7 to the substrate 5. Two pairs of Helmholtz coils 8 are disposed on the right and left ends and the front and back ends of the substrate 5 so that an external magnetic field is applied in two orthogonal directions in parallel with the deposition surface of the substrate during the deposition of a thin film thereon. A heater 9 for heating the substrate 5 is provided on the upper side of the substrate and a thermocouple 10 for measuring the temperature of the substrate 5 is connected to one of the ends of the substrate to control the heating temperature. The lower side of the chamber 4 has an exhaust opening 11 which is connected to a vacuum pump (not shown), so that the chamber is evacuated by operating the vacuum pump. Here, 12 is a monitor for checking the thickness of a film deposited on the substrate 5.

A uniaxial anisotropic magnetic thin film is produced in this evaporating apparatus by heating, by vaporizing, an alloy containing three constituent elements Ni, Co, and Fe in the resistance heating crucible 6 as shown by numeral 43, and depositing the vaporized fine metal particles on the substrate 5 during which applying alternately orthogonal pairs of an external magnetic field generated by Helmholz coils 8.

The two orthogonal external magnetic fields, first and second external magnetic field, are selected to be several tens of Oe.

Alternate frequency or repetition frequency or switching frequency of the first and second external magnetic fields is selected to be in the range of 1 to several tens of Hz.

The magnetic thin film thus produced and the thickness of which is at least 0.05 μm showed an anisotropic magnetic field below 10 Oe.

Although in the process explained above, the Ni-Co-Fe ternary alloy film is obtained by vacuum evaporation of one deposition source of a given composition, and the resistance heating is used as a heating source for deposition, electron beam heating or other heating methods can also be suitably used. The degree of vacuum during deposition is to be $5\times10^{-6}$ Torr or below, and particularly $1\times10^{-6}$ Torr or below is desirable to obtain an alloy film having a low run to run spread and a small anisotropic magnetic field, that is, having a high magnetic permeability. The film deposition is usually carried out by setting the temperature of the substrate within the range of from 200° to 400° C., and the temperature is preferably about 350° C. in order to obtain an alloy film having a higher reproductivity and a smaller anisotropic magnetic field.

One of the production conditions of the magnetic thin film according to this invention by using the apparatus shown in FIG. 4. was as shown in Table 1.

TABLE 1

| | |
|---|---|
| Vacuum reached | $6.2 \times 10^{-7}$ Torr |
| Temperature of the substrate | 350° C. |
| Rate of deposition | 18Å |
| Film thickness | 0.9 μm |
| Alternate orthogonal magnetic fields | |
| magnetic field along direction x | 76 Oe |
| magnetic field along direction y | 27 Oe |
| Repetition frequency | 1 Hz |

For comparison, another magnetic thin film with the same alloy composition was formed under application of a unidirectional external magnets field of 60 Oe.

Figure 5:
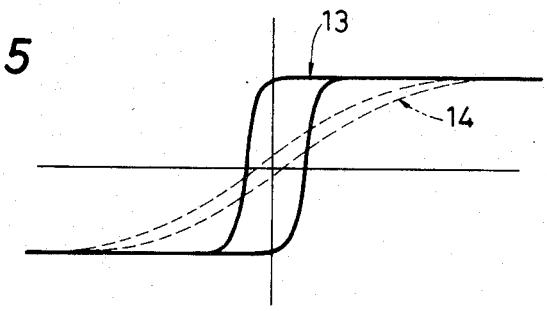
FIG. 5 is a diagram showing the B-H curve of a Ni-Co-Fe ternary alloy film according to this invention.
Figure 6:
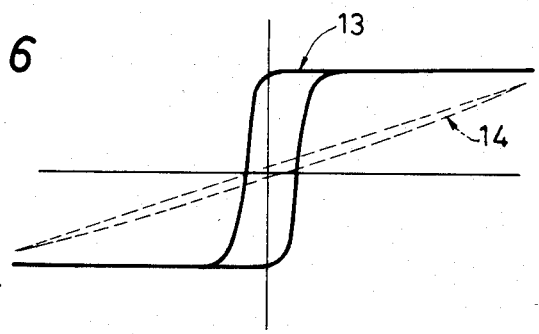
FIG. 6 is a diagram showing the B-H curve of an alloy film according to a conventional process.

FIGS. 5 and 6 show the B-H characteristic of the magnetic thin film of this invention and that of the magnetic thin film for comparison, respectively. In these figures, 13 denotes th B-H curve along an easy axis of magnetization, and 14 denotes that along a hard axis of magnetization. Other magnetic characteristics and composition of the alloy film of this invention are shown in Table 2.

TABLE 2

| | |
|---|---|
| Composition | 57% Ni-33% Co-10% Fe |
| Saturation magnetic flux density | 1.2 T |
| Coercive force along a hard axis | 0.4 Oe |
| Anisotropic magnetic field | 6 Oe |
| Magnetic permeability at 100 MHz | 1400 |

The above results shows that the magnetic thin film according to this invention exhibited a higher saturation magnetic flux density, uniaxial anisotropy of a small anisotropic magnetic field and had a magnetic permeability of as high as 1400 at a higher frequency region such as 100 MHz because of its small anisotropic magnetic field. The thin magnetic film for comparison exhibited also uniaxial anisotropy however had a magnetic permeability at 100 MHz of as low as 500 because of its large anisotropic magnetic field of 18 Oe.

The magnetic permeability in the high-frequency region of the magnetic thin film according to thin invention is further increased when the film is formed in a multilayered structure by sandwiching an insulating material between layers. The magnetic permeability of the multilayered magnetic thin film is furthermore increased, when the total number of layers is increased, or when the thickness of the intermediate insulating material is reduced.

In the production of the Ni-Co-Fe ternary alloy film of this invention, the constituent elements, i.e. Ni, Co, and Fe, have relatively similar vapor pressures, so that it is possible to produce films of the same composition industrially with good reproducibility.

Although the vacuum evaporation process was used in the above preferred embodiment as a method for forming an alloy film, it is not limited thereto in this invention but any method including sputtering, ion plating, metal plating, and splat cooling is effective of course.

From the above description, it will be understood according to this invention to form a uniaxial anisotropic film having a higher saturation magnetic flux density than that of Permalloy, a smaller anisotropic magnetic field and, thus, having a high magnetic permeability in the high-frequency region. Therefore this film is suitable for a core material of a thin-film magnetic head with a higher recording density.

We claim:

1. A process for producing a thin film of Ni-Co-Fe ternary alloy containing at most 75% by weight of Ni, 10 to 90% by weight of Co, and at most 15% by weight of Fe comprising, a step of depositing the ternary alloy on a substrate; and a step of alternately applying a first external magnetic field with a predetermined strength and a second external magnetic field with a predetermined strength over the deposition surface of th substrate at a predetermined frequency during the deposition of the alloy, the first and second external magnetic fields being on a same plane parallel to the deposition surface of the substrate and crossing each other in right angle.

2. A process for producing a thin film of Ni-Co-Fe ternary alloy as set forth in claim 1, wherein the deposition of the thin film is carried out by a method selected from among vacuum evaporation, sputtering, ion plating, and metal plating, by chemical deposition.

3. A process for producing a thin film of Ni-Co-Fe ternary alloy as set forth in claim 1, wherein the magneto-striction constant of the film is in the range of $+2\times10^{-6}$ to $-2\times10^{-6}$ and the film has a uniaxial magnetic anistropy which field is at most 10 Oe.

* * * * *